United States Patent [19]

Banik

[11] Patent Number: 5,742,192
[45] Date of Patent: Apr. 21, 1998

[54] CIRCUIT FOR GENERATING A PULSE SIGNAL TO DRIVE A PULSE LATCH

[75] Inventor: Jashojiban Banik, Aloha, Oreg.

[73] Assignee: Intel Corporation, Santa Clara, Calif.

[21] Appl. No.: 491,489

[22] Filed: Jun. 15, 1995

[51] Int. Cl.$^6$ .................................................. H03K 5/01
[52] U.S. Cl. ..................... 327/166; 327/172; 327/263; 326/29
[58] Field of Search ..................... 327/164–166, 327/291–295, 299, 170, 172–176, 263, 142, 143, 197, 227–230; 326/87, 27, 29

[56] References Cited

U.S. PATENT DOCUMENTS

| | | | |
|---|---|---|---|
| 4,011,468 | 3/1977 | Fosler, Jr. et al. | 327/108 |
| 4,818,904 | 4/1989 | Kobayashi | 327/143 |
| 5,151,614 | 9/1992 | Yamazaki et al. | 327/143 |
| 5,172,012 | 12/1992 | Ueda | 327/143 |
| 5,440,182 | 8/1995 | Dobbelaere | 326/38 |
| 5,498,989 | 3/1996 | Diba | 327/230 |

FOREIGN PATENT DOCUMENTS 5-48407  2/1993  Japan .................................. 327/228

*Primary Examiner*—Timothy P. Callahan
*Assistant Examiner*—Kenneth B. Wells
*Attorney, Agent, or Firm*—Blakely, Sokoloff, Taylor & Zafman

[57] ABSTRACT

A pulse generating circuit includes a first portion and a second portion. The first portion is coupled to a control signal and a first signal, and generates the rising edge of a pulse signal in response to the control signal transitioning to a first state. The second portion receives the rising edge of the pulse signal and causes the first signal to transition to a second state in response to the rising edge of the pulse. The transitioning of the first signal to the second state causes the first portion to generate a falling edge of the pulse signal.

18 Claims, 5 Drawing Sheets

CIRCUIT FOR GENERATING A PULSE SIGNAL TO DRIVE A PULSE LATCH

BACKGROUND OF THE INVENTION

1. Field of the Invention

The present invention pertains to the field of digital circuitry. More particularly, this invention relates to pulse latches.

2. Background

Microprocessor and other synchronous integrated circuit (IC) devices include multiple components which, when operating together, perform the desired function of the chip. The design of microprocessors and other synchronous devices involves consideration of a wide range of factors. These factors include power dissipation of each of the components within the device, the physical area that each of these components occupies, and the speed of the components. One common design goal is to build a device which dissipates a small amount of power, occupies a small amount of space, and is capable of operating at a very fast speed.

One component which generally exists within microprocessors and other synchronous devices is a data latch. A data latch is a component which stores data, typically one bit, for a period of time. The period of time which the data is stored is determined by a latching signal (e.g., a clock signal). Typically, a large number of data latches is included within a device.

One type of data latch which is commonly found in many devices is a master-slave flip-flop. A master-slave flip-flop contains two data latches: a master latch and a slave latch. The master latch receives data on one phase of a clock signal and transfers it to the slave latch. On the second phase of the clock signal, the slave latch keeps the data the master received in the first phase. Thus, master-slave flip-flops are often referred to as two-phase data latches. Master-slave flip-flops can be very useful, however they also have several disadvantages. One such disadvantage is that the data is output from the slave portion of the flip-flop. This can adversely affect overall system speed because of the long chain of gates (that is, the two data latches) which data must travel through before being output. Additionally, the long chain of gates which data passes through in a master-slave flip-flop requires additional physical space within the device as well as additional power consumption.

One type of data latch which solves some of the problems of the master-slave flip-flop is the pulse latch. A pulse latch is a single-phase latch which stores data based on a pulse (typically, these pulses are much shorter than one phase of the clock signal). Pulse latches are single latches which do not have the dual-latch structure of the master-slave flip-flop. Pulse latches can be used in place of master-slave flip-flops in many situations and provide several advantages. These advantages include pulse latches being typically smaller than master-slave flip-flops and typically dissipating less power than master-slave flip-flops. Thus, it would be advantageous to provide a mechanism which supports pulse latches in microprocessors and other synchronous devices.

One mechanism necessary to support a pulse latch is a pulse generator to provide the pulse signal. Thus, it would be beneficial to provide a pulse generator which generates the necessary pulses to support a pulse latch.

However, if the pulse generator occupies too much physical space or dissipates too much power, then the advantages of the pulse latch can be offset by the presence of the pulse generator. Thus, it would be advantageous to provide a pulse generator which dissipates a small amount of power and occupies a small amount of physical space.

Additionally, a single-phase pulse latch typically allows data to flow into and get latched into the pulse latch only when it is receiving the pulse signal. Therefore, the pulse signal provided to the pulse latch must have a minimum pulse width in order to ensure that the data is latched properly. The required minimum pulse width, however, can vary depending on the other components in the device. Thus, it would be beneficial to provide a pulse generator which allows the minimum pulse width to be easily controlled.

The present invention provides for these and other advantageous results.

SUMMARY OF THE INVENTION

A pulse generating circuit is described herein. The pulse generating circuit includes a first portion and a second portion. The first portion is coupled to a control signal and a first signal, and generates the rising edge of a pulse signal in response to the control signal transitioning to a first state. The second portion receives the rising edge of the pulse signal and causes the first signal to transition to a second state in response to the rising edge of the pulse. The transitioning of the first signal to the second state causes the first portion to generate a falling edge of the pulse signal.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In the following detailed description numerous specific details are set forth in order to provide a thorough understanding of the present invention. However, it will be understood by those skilled in the art that the present invention may be practiced without these specific details. In other instances, well known methods, procedures, components, and circuits have not been described in detail so as not to obscure aspects of the present invention.

In the descriptions which follow reference is made to logical zeroes and logical ones. A logical zero typically represents a voltage of between 0.0 and 0.5 volts. When a particular signal or node is a logical zero, the signal or node is referred to as being low or in a low state. A logical one typically represents a voltage of between 1.8 and 5.5 volts. When a particular signal or node is a logical one, the signal or node is referred to as being high or in a high state. It is to be appreciated, however, that the voltages which represent a logical zero or a logical one can be different than the ranges mentioned above.

Metal-oxide semiconductor (MOS) transistors are also discussed in the descriptions which follow. A transistor is an electronic component which typically comprises two terminals (commonly referred to as source and drain) and a gate terminal. Two general types of transistors are typically used: p-channel transistors and n-channel transistors. In an n-channel transistor, current flows between the two terminals when greater than a threshold voltage is applied to the gate terminal (that is, the transistor is turned on). Generally, the greater the voltage, the greater the current flow between the terminals. If the voltage applied to the gate terminal is less than the threshold voltage, then current does not flow between the two terminals (that is, the transistor is turned off). Similarly, in a p-channel transistor, current does not flow between the two terminals when greater than a threshold voltage is applied to the gate terminal (that is, the transistor is turned off). Otherwise, current does flow between the two terminals (that is, the transistor is turned on). Generally, the lower the voltage, the greater the current flow between the terminals. Transistors are well-known to those skilled in the art and thus will not be described further.

Figure 1:
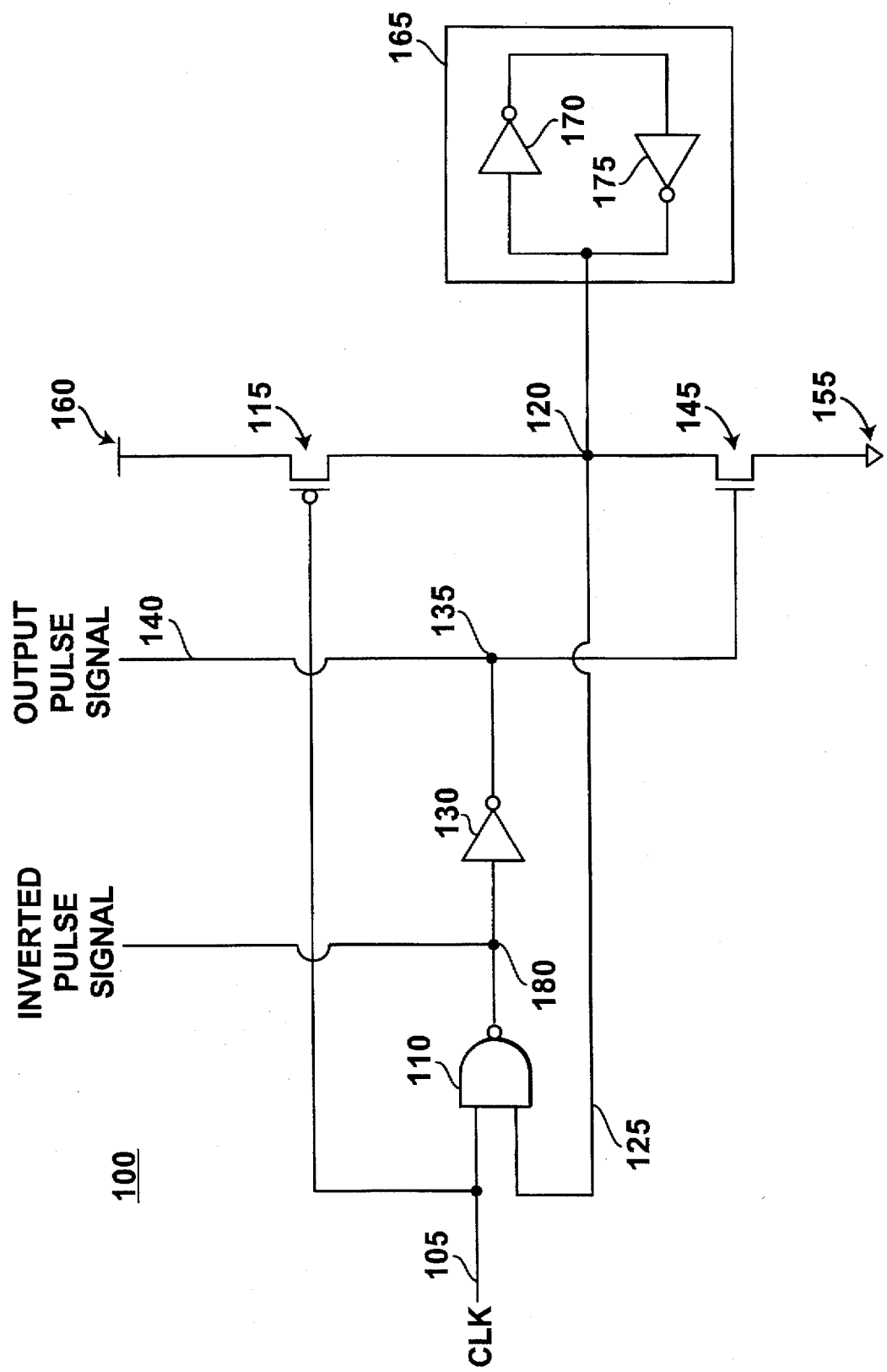
FIG. 1 is a schematic diagram showing a pulse generator according to one embodiment of the present invention.

FIG. 1 is a schematic diagram showing a pulse generator according to one embodiment of the present invention. Pulse generator 100 receives as an input a control signal 105. In one implementation, control signal 105 is a clock signal. In the descriptions which follow, control signal 105 is discussed as a clock signal. However, it is to be understood that control signal 105 can be any type of input control signal, and specifically is not limited to the clock signal.

Clock signal 105 is coupled to the gate terminal of p-channel transistor 115 and is coupled to logical NAND gate 110 as an input. NAND gate 110 also receives signal 125 as an input, which carries the signal from node 120. NAND gate 110 is a conventional logical NAND gate. NAND gate 110 outputs a logical zero whenever both inputs to NAND gate 110 are logical ones; otherwise, the output of NAND gate 110 is a logical one.

The output of NAND gate 110 is coupled to the input of inverter 130, which inverts the output of NAND gate 110. Thus, NAND gate 110 and inverter 130 operate together as a logical AND device. The output of inverter 130 is coupled to node 135. The value of node 135 is output from pulse generator 100 as a pulse signal.

When clock signal 105 is in a low state, p-channel transistor 115 is turned on. P-channel transistor 115 being turned on, in conjunction with voltage source 160 causes node 120 to transition to a high state. In one embodiment, voltage source 160 is a 5-volt source. However, it is to be appreciated that voltage source 160 can have different values. In one embodiment, typical values for voltage source 160 are the values which are defined as a logical one.

Node 135 is also coupled to the gate terminal of n-channel transistor 145. Thus, when node 135 transitions to a high state, n-channel transistor 145 is turned on. N-channel transistor 145 being turned on, in conjunction with ground 155, causes node 120 to transition to a low state. Node 120 being in a low state results in signal 125 being a low signal input to NAND gate 110. In one embodiment of the present invention, ground 155 is at 0.0 volts. However, it is to be appreciated that ground 155 can have different values. In one embodiment, typical values for ground 155 range from 0.0 volts to 0.5 volts.

When clock signal 105 is in a low state, signal 125 is in a high state due to transistor 115 being turned on. Thus, as soon as clock signal 105 transitions to a high state, the output of NAND gate 110 transitions to a low state, causing node 135 to transition to a high state. This generates the rising edge of the pulse which is output as pulse signal 140. However, node 135 transitioning to a high state causes n-channel transistor 145 to turn on, and clock signal 105 transitioning to a high state causes p-channel transistor 115 to turn off. Thus, node 120 transitions to a low state, which causes NAND gate 110 to output a logical one, thereby resulting in node 135 transitioning to a low state again. This transition to a low state by node 135 generates the falling edge of the pulse which is output by pulse generator 100 on pulse signal 140. This transition to a low state also causes n-channel transistor 145 to turn off. Note, however, that node 120 remains in a low state due to storage element 165, discussed in more detail below.

When clock signal 105 again transitions to a low state, the output of NAND gate 110 remains high, however p-channel transistor 115 is again turned on. This causes node 120 and signal 125 to transition to a high state. Thus, NAND gate 110 will output a logical zero when the clock signal 105 again transitions to a high state.

Thus, it can be seen that the rising edge of the pulse from pulse generator 100 is triggered by the rising edge of clock signal 105. However, the falling edge of the pulse from pulse generator 100 is independent of the falling edge of the clock signal. Thus, the width of the pulse created by pulse generator 100 depends on the circuitry within pulse generator 100, not clock signal 105.

Storage element 165 maintains the value of node 120 when both n-channel transistor 145 and p-channel transistor 115 are turned off. Node 120 is coupled to the input of inverter 170 and the output of inverter 175. Thus, the value at node 120 is inverted by inverter 170, then inverted again back to its original value by inverter 175. Thus, the storage element 165 prevents the value of node 120 from floating when transistors 115 and 145 are turned off. That is, when both n-channel transistor 145 and p-channel transistor 115 are turned off, node 120 maintains the state it had just prior to the most recent transistor turning off.

In one implementation, pulse generator 100 also outputs a signal from node 180. Node 180 provides an inverted pulse signal which can be output to and used by latching circuitry driven by the pulse generator. Alternatively, pulse generator 100 may provide only the pulse signal 140 to the latching circuitry.

Thus, pulse generator 100 generates a pulse signal which can be used by a pulse latch. Pulse generator 100 utilizes a small number of components: two transistors, a logical AND device, and two inverters. This small number of elements provides several advantages, including pulse generator 100 occupying a small amount of area on an integrated circuit (IC) chip due to the small number of transistors and gates used in the generator. Additionally, pulse generator 100 dissipates little power due to the small number of transistors and gates used in the generator.

It should be noted that node 120 can have very low capacitance. Thus, the p-channel transistor 115 and n-channel transistor 155 can be very small because the node they are coupled to (that is, node 120) is not a high capacitance node.

It should also be noted that the width of the pulse generated by pulse generator 100 can be controlled by n-channel transistor 145. As discussed above, the rising edge of the pulse is generated when node 135 transitions high, which is done in response to clock signal 105 transitioning high. When node 135 transitions high, n-channel transistor 145 is turned on, thereby causing node 120 to transition to a low state. Once node 120 transitions to a low state, signal 125 is low, thereby causing NAND gate 110 to output a logical one and node 135 to transition to a low state. This transitioning of node 135 to a low state causes pulse signal 140 to transition low, thereby creating the falling edge of the pulse. Thus, the speed with which n-channel transistor 145 turns on controls the transitioning of node 120 to a low state, and thus controls the falling edge of the pulse signal. Therefore, modifying n-channel transistor 145 allows the pulse width to be altered. For example, gate-to-drain, drain-to-substrate, and source-to-substrate capacitances exist within transistor 125. These capacitances can be altered in a conventional manner by, for example, changing the length and/or width of the channel between the source and drain in the substrate layer. Modifying transistors to obtain different transition times is well-known to those skilled in the art and thus will not be discussed further.

Figure 2:
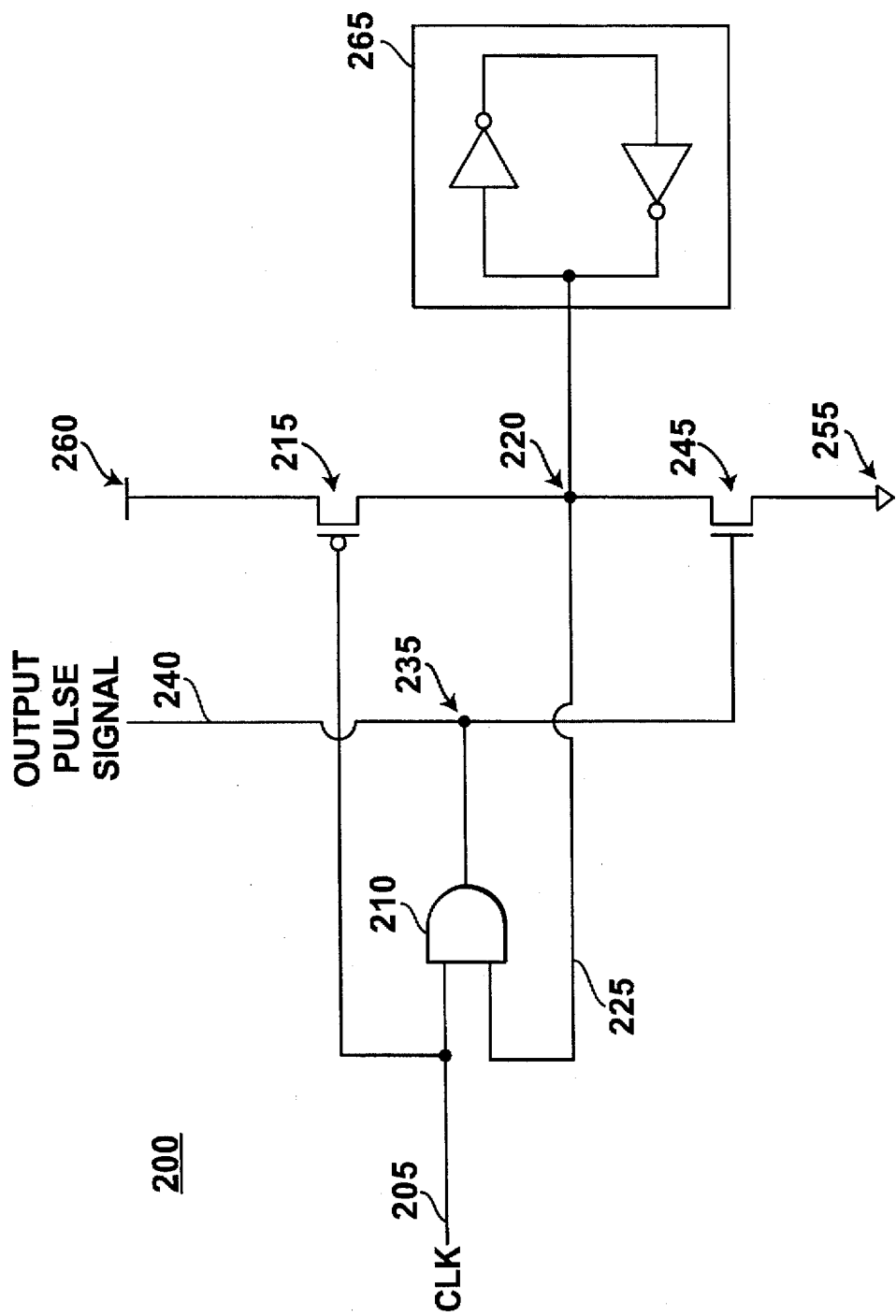
FIG. 2 is a schematic diagram showing a pulse generator according to an alternate embodiment of the present invention.

FIG. 2 is a schematic diagram showing a pulse generator according to an alternate embodiment of the present invention. The pulse generator 200 shown in FIG. 2 is similar to the pulse generator 100 of FIG. 1, however logical NAND gate 110 and inverter 130 of FIG. 1 have been replaced with logical AND gate 210. Thus, the two-gate logical AND device of FIG. 1 is replaced with a single-gate logical AND device in FIG. 2. Additionally, only a single signal, pulse signal 240, is output from pulse generator 200.

In pulse generator 200, when clock signal 205 is low, p-channel transistor 215 is turned on and the output of logical AND gate 210 is low. This causes node 235 and pulse signal 240 to be in a low state. When node 235 is in a low state, n-channel transistor 245 is turned off, thus node 220 and signal 225 both remain high. When clock signal 205 transitions to a high state, p-channel transistor 215 is turned off and the output of logical AND gate 210 is high. This causes node 235 and pulse signal 240 to transition to a high state, thereby generating the rising edge of pulse signal 240. However, node 235 transitioning high causes n-channel transistor 245 to turn on which, in conjunction with p-channel transistor 215 having been turned off, causes node 220 to transition to a low state. Node 220 remains in the low state due to storage element 265. Node 220 transitioning to a low state causes input signal 225 to transition to a low state, thereby resulting in logical AND gate 210 and node 235 transitioning to a low state. Node 235 transitioning to a low state generates the falling edge of the pulse signal on pulse signal 240.

It should be noted that the pulse generator of FIG. 2 contains only a single pulse signal 240. Thus, latching circuitry which uses both the pulse signal and the inverted pulse signal should invert the pulse received on pulse signal 240 itself.

Figure 3:
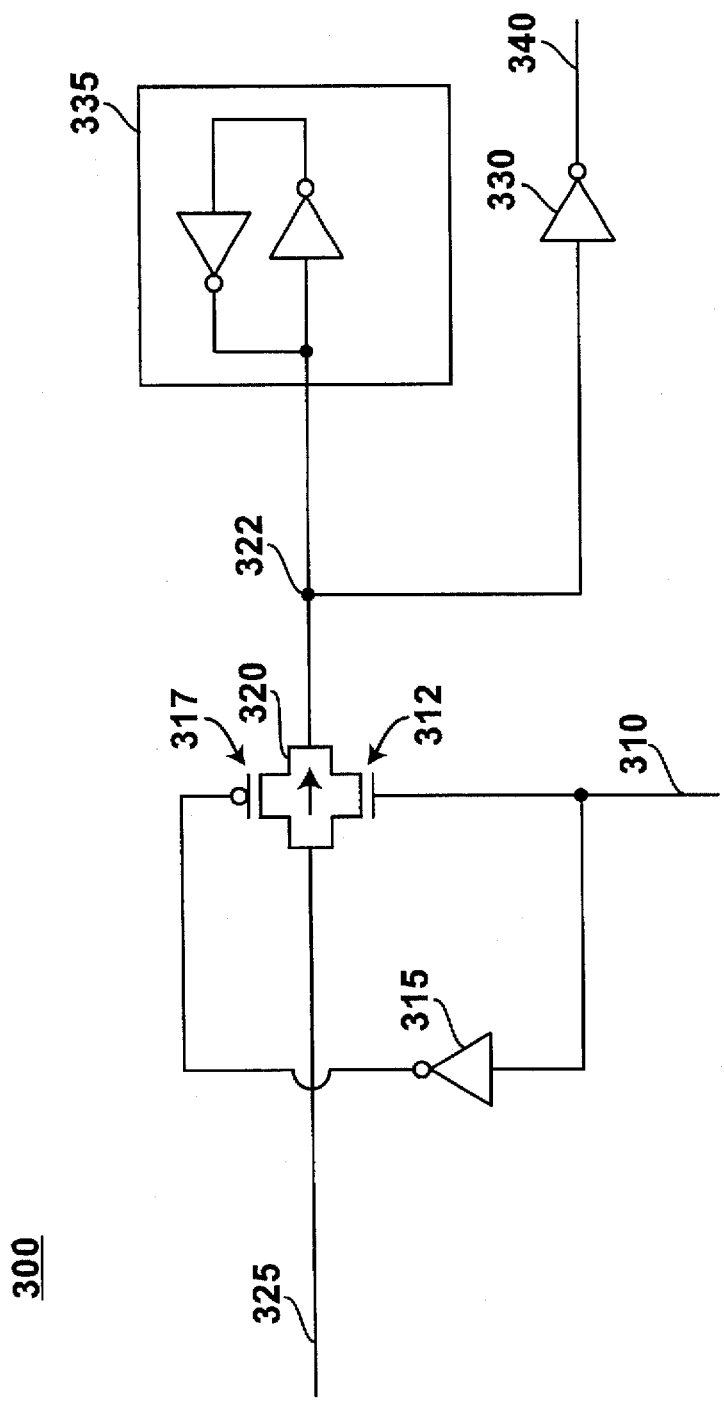
FIG. 3 is a schematic diagram showing a pulse latch which can be used with the pulse generator of the present invention.

FIG. 3 is a schematic diagram showing a pulse latch which can be used with the pulse generator of the present invention. Pulse latch 300 receives a pulse signal 310 from a pulse generator. In one embodiment, pulse signal 310 is pulse signal 140 of FIG. 1. Alternatively, pulse signal 310 may be pulse signal 240 of FIG. 2.

Pulse signal 310 is coupled to complementary pass gate 320 at terminal 312. Complementary pass gate 320 is a conventional pass gate, which is well-known to those skilled in the art. In addition, pulse signal 310 is also input to inverter 315, which inverts the pulse signal. The output of inverter 315 is coupled to complementary pass gate 320 at terminal 317. Thus, when pulse signal 310 is low, complementary pass gate 320 is turned off. However, when pulse signal 310 is high, complementary pass gate 320 is turned on and data in signal 325 passes through complementary pass gate 320. Pass gate 320 again turns off when pulse signal 310 transitions low.

The signal that is passed through pass gate 320 is maintained at node 322 by storage element 335. Storage element 335 operates analogously to storage element 165 of FIG. 1. In one embodiment, node 322 is also coupled to the input of inverter 330. Inverter 330 inverts the value maintained at node 322, which is the value of data in signal 325 as passed by complementary pass gate 320. The output of inverter 330 is available as data out signal 340. In an alternate embodiment, the output of latch 300 is the value maintained at node 322.

In an alternate embodiment, latch 300 does not include inverter 315. In this alternate embodiment, pulse signal 310 is coupled to complementary pass gate 320 at terminal 312 as shown. However, a second signal is input to latch 300 from the pulse generator. This second signal is coupled to complementary pass gate 320 at terminal 317. In one embodiment, this second signal is received from node 180 of pulse generator 100 of FIG. 1.

It is to be appreciated that the pulse latch of FIG. 3 is one of many latches which can be driven by the pulse generator of the present invention. A further discussion of pulse latches which can be used with the present invention can be found in U.S. patent application Ser. No. 08/283,643, entitled "Differential Latch Circuit", which is assigned to the assignee of the present invention.

Figure 4:
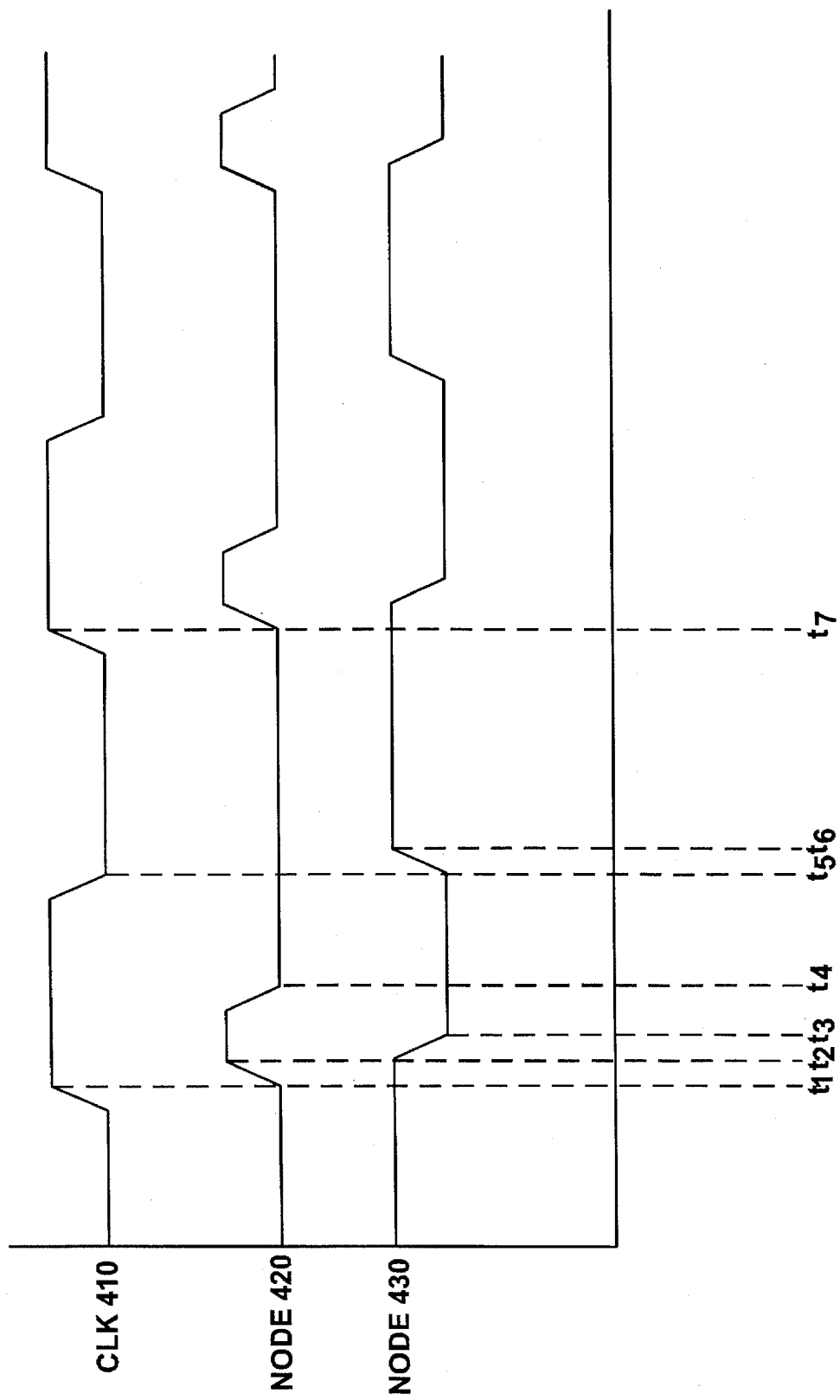
FIG. 4 is a timing diagram showing the relationship between the clock signal and certain nodes of the pulse generator according to one embodiment of the present invention.

FIG. 4 is a timing diagram showing the relationship between the clock signal and certain nodes of the pulse generator according to one embodiment of the present invention. Node 420 represents the pulse signal output of the pulse generator. In one embodiment, clock 410, node 420 and node 430 show the states of clock signal 105, node 135 and node 120 of FIG. 1, respectively. In an alternate embodiment, clock 410, node 420 and node 430 show the states of clock signal 205, node 235 and node 220 of FIG. 2, respectively.

As shown in FIG. 4, when clock 410 transitions to a high state at time $t_1$, node 420 transitions to a high state at time $t_2$ after a short delay. This delay between time $t_1$ and time $t_2$ is caused by the signal propagation delay of NAND gate 110 and inverter 130 of FIG. 1, as well as propagation delays in the lines connecting the components. Similarly, node 430 transitions to a low state at time $t_3$ shortly after node 420 transitions to a high state. The delay between time $t_3$ and time $t_2$ is caused by the amount of time required for n-channel transistor 145 to turn on and pull node 120 down to a low state.

Node 420 transitions to a low state at time $t_4$ a short period of time after node 430 transitions to a low state. The delay between time $t_4$ and $t_3$ is caused by propagation delays in NAND gate 110 and inverter 130 of FIG. 1, as well as propagation delays in the lines connecting the components. Thus, by time $t_4$ the pulse signal has been generated.

Clock signal 410 subsequently transitions to a low state at time $t_5$. The duration of the high state of the clock pulse is dependent on the external circuitry which generates the clock signal. The delay between time $t_5$ and time $t_1$ is independent of the pulse generating circuitry of the present invention.

In response to clock signal 410 transitioning low at time $t_5$, node 430 transitions high at time $t_6$. The delay between time $t_6$ and time $t_5$ is caused by the period of time necessary for transistor 115 of FIG. 1 to turn on and charge node 120 up to a high state. Thus, with node 430 being at a high state, the pulse generating circuitry is ready to output the next pulse as soon as the clock signal transitions high at time $t_7$.

In one embodiment of the present invention, the width of the pulse is determined by the requisite set-up time of the latch(es) being driven by the pulse. That is, the width of the pulse should be at least as long as is necessary for the slowest latch being driven by the pulse to turn on the necessary transistors and/or pass gates and latch in the data.

Figure 5:
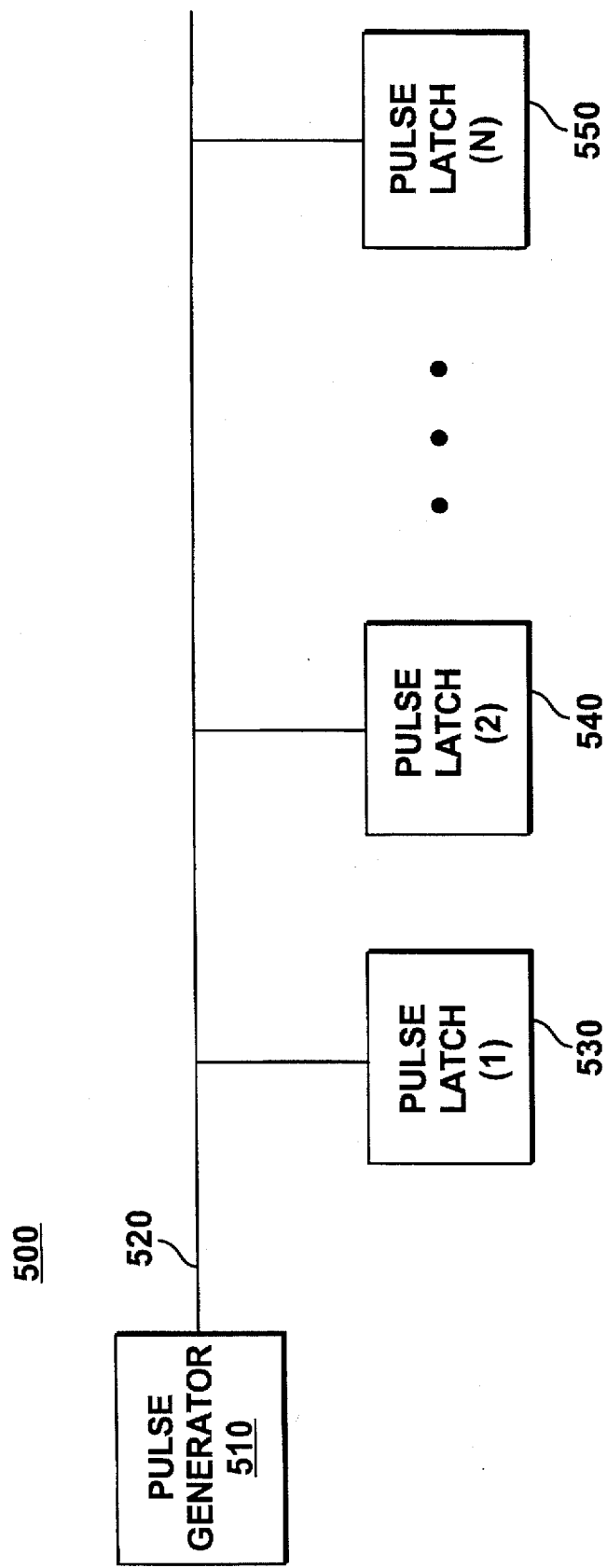
FIG. 5 shows a pulse latch array configuration which can be supported by the pulse generator according to one embodiment of the present invention.

FIG. 5 shows a pulse latch array configuration which can be supported by the pulse generator of the present invention. Array configuration 500 includes a pulse generator 510 and pulse latch circuits 530, 540 and 550. Pulse generator 510 outputs a pulse signal 520. In one embodiment, pulse generator 510 and pulse signal 520 are pulse generator 100 and pulse signal 140 of FIG. 1, respectively. In an alternate embodiment, pulse generator 510 and pulse signal 520 are pulse generator 200 and pulse signal 240 of FIG. 2, respectively.

Pulse generator 510 is shown driving N pulse latches. In one embodiment, pulse generator 510 can drive between one and 200 pulse latches.

In an alternate embodiment of the present invention, an inverted pulse signal is also output by pulse generator 510. This additional signal provides an inverted pulse signal from generator 510. In one implementation, this inverted pulse signal is the signal from node 180 of FIG. 1.

Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims, which in themselves recite only those features regarded as essential to the invention.

Thus, a pulse generating circuit has been described.

I claim:

1. A pulse generating circuit for generating a pulse signal used to drive a pulse latch, the circuit comprising:
   a first portion including,
      a logical AND device to receive a control signal and a first signal,
      a first transistor having a first terminal to be coupled to a voltage source, a second terminal coupled to the first signal, and a gate terminal coupled to the control signal,
      wherein the first portion is operative to generate a rising edge of the pulse signal in response to the control signal transitioning to a first state, and wherein the first portion is also operative to provide the pulse signal to the pulse latch; and
   a second portion, coupled to the first portion, operative to receive the rising edge of the pulse signal and to cause the first signal to transition to a second state in response to the rising edge of the pulse signal, the first portion operative to generate a falling edge of the pulse signal in response to the first signal transitioning to the second state.

2. The pulse generating circuit of claim 1, further comprising a storage portion coupled to the first portion and the second portion.

3. The pulse generating circuit of claim 2, wherein the storage portion comprises:
   a first inverter having an input and an output; and
   a second inverter having an input and an output, wherein the output of the second inverter is coupled to the input of the first inverter and the output of the first inverter is coupled to the input of the second inverter.

4. The pulse generating circuit of claim 1, wherein the second portion comprises:
   a second transistor having a first terminal coupled to a ground, a second terminal coupled to the first signal, and a gate terminal coupled to an output of the logical AND device.

5. A pulse generating circuit for generating a pulse signal used to drive a pulse latch, the circuit comprising:
   a first transistor having a first terminal coupled to a voltage, a gate terminal coupled to a control signal, and a second terminal coupled to a node;
   a second transistor having a first terminal coupled to the node, a second terminal coupled to a ground, and a gate terminal, the first and second transistors operating together to generate a first signal at the node; and
   a logical AND device which outputs the pulse signal to the pulse latch, the logical AND device having a first input coupled to the control signal, a second input coupled to the second terminal of the first transistor, and an output coupled to the gate terminal of the second transistor.

6. The pulse generating circuit of claim 5, wherein the first transistor is a p-channel transistor.

7. The pulse generating circuit of claim 5, wherein the second transistor is an n-channel transistor.

8. The pulse generating circuit of claim 5, wherein the control signal is a clock signal.

9. The pulse generating circuit of claim 5, wherein the logical AND device is a logical AND gate.

10. The pulse generating circuit of claim 5, further comprising a storage device coupled to the second terminal of the first transistor.

11. The pulse generating circuit of claim 10, wherein the storage device comprises:
    a first inverter having an input and an output; and
    a second inverter having an input and an output, wherein the output of the second inverter is coupled to the input of the first inverter and the output of the first inverter is coupled to the input of the second inverter.

12. The pulse generating circuit of claim 11, wherein the output of the second inverter is also coupled to the second terminal of the first transistor.

13. The pulse generating circuit of claim 5, wherein the logical AND device comprises:
    a logical NAND gate having an output; and
    an inverter having an input coupled to the output of the logical NAND gate.

14. The pulse generating circuit of claim 13, further comprising an inverted pulse output coupled to the output of the logical NAND gate.

15. A pulse generating circuit for generating a pulse signal used to drive a pulse latch, the circuit comprising:
    first means for generating a rising edge of the pulse signal, the first means including a logical AND device configured to receive a control signal and a first signal, and a first transistor having a first terminal coupled to a voltage source, a second terminal coupled to the first signal, and a gate terminal coupled to the control signal, wherein the first means is for generating the rising edge of the pulse signal responsive to the control signal transitioning to a first state, the first means also for providing the pulse signal to the pulse latch; and
    second means, coupled to the first means, for receiving the rising edge of the pulse signal, wherein the second means is also for causing the first signal to transition to a second state in response to the rising edge of the pulse signal, and the first means is also for generating a falling edge of the pulse signal responsive to the first signal transitioning to the second state.

16. The pulse generating circuit of claim 15, further comprising a storage means coupled to the first means and the second means.

17. The pulse generating circuit of claim 16, wherein the storage means comprises:

a first inverter having an input and an output; and a second inverter having an input and an output, wherein the output of the second inverter is coupled to the input of the first inverter and the output of the first inverter is coupled to the input of the second inverter.

18. The pulse generating circuit of claim 15, wherein the second means comprises:

a second transistor having a first terminal coupled to a ground, a second terminal coupled to the first signal, and a gate terminal coupled to an output of the logical AND device.

* * * * *